(12) United States Patent
Garcia

(10) Patent No.: US 7,173,552 B1
(45) Date of Patent: Feb. 6, 2007

(54) HIGH ACCURACY SEGMENTED DAC

(75) Inventor: Santiago Iriarte Garcia, Limerick (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/926,112

(22) Filed: Aug. 25, 2004

Related U.S. Application Data

(60) Provisional application No. 60/507,914, filed on Oct. 1, 2003.

(51) Int. Cl.
*H03M 1/66* (2006.01)

(52) U.S. Cl. ........................................ 341/144; 341/120

(58) Field of Classification Search ................ 341/144, 341/150, 120, 121, 118
See application file for complete search history.

(56) References Cited

U.S. PATENT DOCUMENTS

| | | | | |
|---|---|---|---|---|
| 4,405,916 A * | 9/1983 | Hornak et al. ............... | 341/118 |
| 6,130,632 A * | 10/2000 | Opris ........................... | 341/120 |
| 6,137,430 A * | 10/2000 | Lyden et al. ................. | 341/145 |
| 6,424,283 B2 * | 7/2002 | Bugeja et al. ............... | 341/145 |
| 6,452,527 B2 | 9/2002 | Takeya et al. | |
| 6,507,296 B1 * | 1/2003 | Lee et al. .................... | 341/120 |
| 6,507,926 B1 * | 1/2003 | Wright ......................... | 714/776 |
| 6,650,265 B1 * | 11/2003 | Bugeja ......................... | 341/144 |
| 6,738,000 B2 * | 5/2004 | Boxho ........................... | 341/120 |
| 6,906,652 B2 * | 6/2005 | Bugeja ......................... | 341/145 |
| 6,927,719 B1 * | 8/2005 | Siniscalchi ................... | 341/144 |
| 7,095,351 B2 * | 8/2006 | Kirby et al. .................. | 341/154 |
| 2002/0012152 A1 * | 1/2002 | Agazzi et al. ............... | 359/189 |

OTHER PUBLICATIONS

Van der Plas, G.A.M, et al, "A 14-bit intrinsic accuracy $Q^2$ random walk CMOS DAC", IEEE Journal of Solid-State Circuits, vol. 34, No. 12, Dec. 1999, pp. 1708-1718.

Wegener, C., et al, "Linear model-based error identification and calibration for data converters", IEEE Computer Society, Proceedings of the Design, Automation and Test in Europe Conference and Exhibition, 2003, Jan. 2003.

* cited by examiner

*Primary Examiner*—Peguy JeanPierre
(74) *Attorney, Agent, or Firm*—Wolf, Greenfield & Sacks P.C.

(57) ABSTRACT

A N-bit segmented digital to analog converter (DAC) adapted to provide an analog signal output on the basis of a digital input code, the DAC being formed from a plurality of individual segments, the segments being selectively combined to effect the output from the DAC determined by the input and wherein the number of segments is given by $2^N-1+x$ where x is greater or equal to one, and at least one of the segments has a weighting less than that of the least significant bit (LSB) of the overall DAC.

22 Claims, 7 Drawing Sheets

HIGH ACCURACY SEGMENTED DAC

FIELD OF THE INVENTION

The present invention relates to digital to analog converters (DAC) and in particular to a segmented DAC architecture adapted to provide for improved linearity in operation.

BACKGROUND OF THE INVENTION

DAC architectures are well known in the art. Fully segmented or thermometer coded architectures are well known and widely used in DAC's as the main DAC of a segmented converter or as the whole DAC itself.

It will be understood that the minimum number of elements selected for a segmented DAC will depend on the application to which the DAC is applied. In certain applications, a fully segmented DAC has $2^N$ unitary elements, where N is the resolution of the converter, whereas in other applications, it may have $2^N-1$ elements depending on whether the output for input code 0 is zero or one LSB (least significant bit). Each element, if selected, contributes the output equivalent to a least significant bit. The elements are typically selected from circuit components such as current sources, resistors, capacitors or the like as will be well known to those skilled in the art. DAC's are sometimes categorised as charge-scaling, voltage-scaling or current scaling DAC's. An example of a segmented DAC 100 is shown in FIG. 1. Here, it will be seen a digital input word 105 is fed to a decoder 110. Based on the decoding effected for that choice of input word, one or more of the $2^N$ available elements 115 are selected to provide the equivalent analog output.

Examples of known architectures include those of U.S. Pat. No. 6,452,527, which describes how current sources of in a conventional segmented architecture DAC may be switched in a certain order so that the non-linearities in the DAC caused by gradients are improved.

Another known technique is described in G. A. M. Van der Plas et. al. "A 14-bit Intrinsic Accuracy $Q^2$ Random Walk CMOS DAC", IEEE Journal of Solid State Circuits, Vol. 34, No. 12, pp. 1708–1718, December 1999. Here, a segmented N-bit DAC is described having $16\times2^N$ sub-segments with each one of the individual sub-segments having a weighting of 1/16 of an LSB. The architecture is arranged so as to spread each segment (made up of 16 sub-segments) in the layout to cancel errors due to gradients in the process.

C. Wegener and MP Kennedy describe the use of an arbitrary segment configuration for calibration of an N-bit DAC architecture having $2^N$ segments ("Linear model based error identification and calibration for data converters", Europe Conference and Exhibition in Design, Automation and Test 2003, pp 630–635, 2003). They describe how each of the segments may be measured and then recombined on decoding. However, the accuracy improvement after calibration is not very high.

There therefore still exists a need to provide an improved DAC, which is specifically adapted to provide for high accuracy applications.

SUMMARY OF THE INVENTION

These and other problems associated with the prior art are obviated by a DAC in accordance with the present invention which provides for the calibration of the DAC by measurement of the outputs of a set of segments and the determination of selections of sub-sets of segments for use with particular input digital words, and the use of that calibrated set in subsequent decoding of input digital words. In one embodiment, the number of segments in the converter is greater than ordinarily necessary for a specific application.

By incorporating more individual elements or segments than are strictly required the present invention enables a level of redundancy to be incorporated into the selection process. At least some of the individual segments are provided with a smaller weight than the LSB of the overall DAC, and as such can be selectively combined or configured for each input code. Using such a methodology, the present invention is advantageous in that significant improvements in linearity may be achieved. These improvements may be traced to the use of the higher number of segments and the smaller than 1 LSB weighting used for all or some of the segments, so as to enable greater freedom in the selection availability for each code during calibration of DAC. The initial calibrated combinations of the segments are then stored in an accessible memory associated with the DAC for subsequent use during operational decoding.

In accordance with a first embodiment, the present invention provides an N-bit segmented digital to analog converter (DAC) adapted to provide an analog signal output in response to an N-bit digital input code, the DAC being formed from a plurality of individual segments, the segments being selectively combined to effect the output from the DAC determined by the input and wherein the minimum number of segments required for a given application is incremented by an additional number of segments, at least one of the segments has a weighting less than that of the least significant bit (LSB) of the overall DAC, and the selective combination of segments for a specific input word is determined from examination of a calibrated table of pre-selected combinations associated with the DAC.

It will be appreciated that the selective combination of the segments is provided by a calibration of the optimal combination of individual segments that may be combined for a desired input control word or code, the calibrated combination being stored in a memory accessible from the DAC.

The present invention also provides a method of implementing an N-bit DAC comprising the steps of:

providing $2^N+x$ individual segments, where x is greater than or equal to one, and the individual segments can be selectively combined to provide an analog output depending on a digital input control code, measuring the output of each of the individual segments, determining an optimum selection of individual segments for a selection of input control codes, and storing said optimised selection for subsequent use in decoding each subsequent input control code.

The determining of an optimum selection of individual segments is desirably effected during a calibration of the DAC.

The determining of an optimum selection may additionally include the step of calculating an average of the segments.

Typically, the weight of at least one of the individual segments is less than or equal to the weight of the LSB of the overall DAC. It will be further appreciated that certain applications may require the weightings of individual segments to differ from those of other individual segments.

In another embodiment the invention provides, a segmented digital to analog converter (DAC) adapted to provide an analog signal output on the basis of an N-bit digital input code, the DAC being formed from:

a first group of individual segments in which the output of each segment is equivalent to a least significant bit and a second group of segments in which the output of each segment is less than equivalent to a least significant bit, wherein the outputs of the first and second group of segments are combined to effect the output from the DAC, wherein the combinations of segments from the first and second groups are advantageously selected to minimise linearity errors.

These and other features of the present invention will be better understood with reference to the following drawings.

DETAILED DESCRIPTION OF THE DRAWINGS

Figure 1:
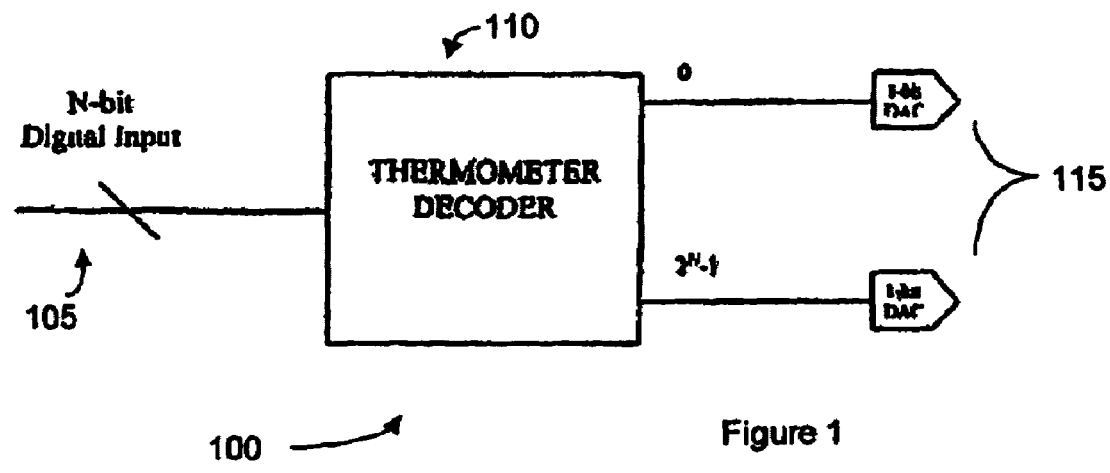
FIG. 1 is an example of a prior art segmented DAC.

FIG. 1 has been described with reference to the prior art.

Figure 2:
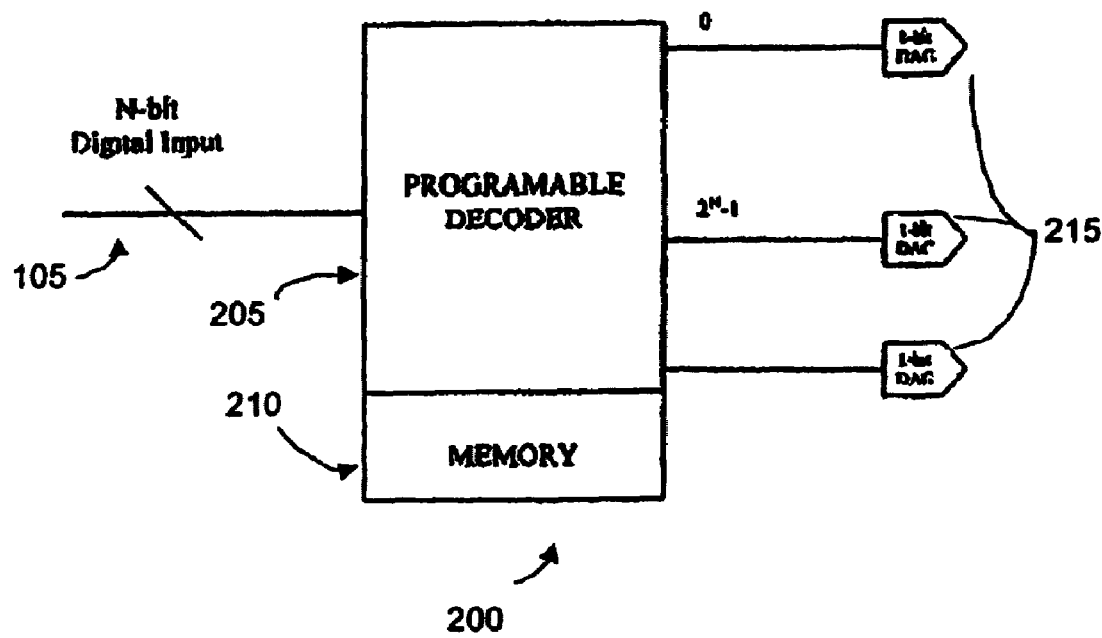
FIG. 2 is an example of a segmented DAC in accordance with the present invention.

FIG. 2 shows an N-bit segmented DAC 200 with a higher number of segments 215 ($2^n+x$ instead of $2^n$), where some or all of them have a smaller weight than the LSB of the overall DAC, in accordance with the present invention. By being able to selectively connect any combination of the individual segments that will contribute to the analog output for each code, using a decoding scheme 205, a significant improvement in the linearity of the DAC can be achieved. The segmented DAC 200 in accordance with the present invention utilises the decoder 205 in conjunction with a memory 210 to enable a storing of the calibrated combination of segments connected for each input code. The linearity improvement is limited by the number of segments and their weights relative to the LSB of the DAC. Ideally, any accuracy can be achieved for an N-bit DAC, and as will be appreciated the only limitation is the resolution of the test system used in the calibration process for the measurements of the output of each segment. During subsequent use, the set of combinations stored from calibration are accessed to determine the most appropriate combination for any input digital code.

The freedom in the decoding which is provided by the arrangement of the present invention allows the designer to optimize the linearity for each specific design, and calibration may be optimised for accuracy and yet still be monotonic by architecture. Monotonic means that the analog output always increases when the digital input increases.

By providing more segments than necessary, the arrangement of the present invention is advantageous in that there are provided a higher number of possible combinations per code, as compared with the normal case where only $2^N$ segments elements are available in an N-bit converter.

Figure 3:
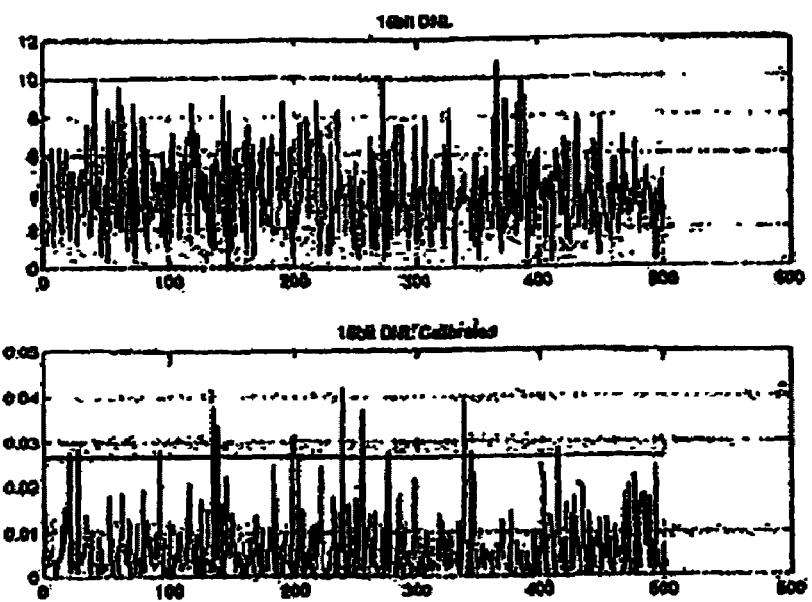
FIG. 3 shows DNL simulations (at 16-bit level) of a 4-bit DAC over 500 randomizations before and after calibration in accordance with the present invention.
Figure 4:
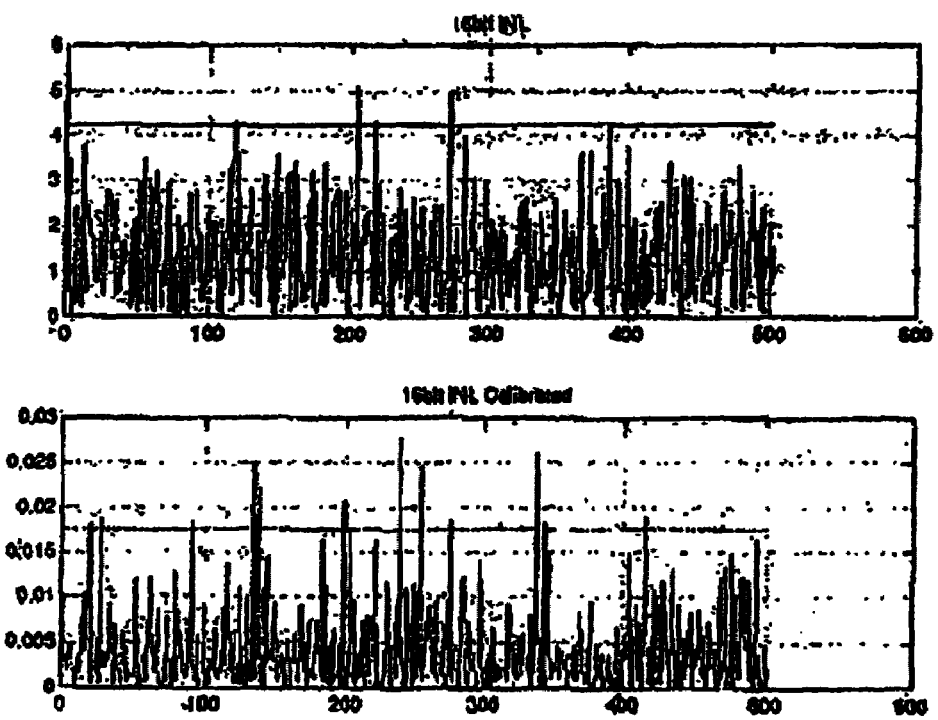
FIG. 4 shows INL simulations (at 16-bit level) of a 4-bit DAC over 500 randomizations before and after calibration in accordance with the present invention.

A first example where a significant increase in the initial accuracy of a 4-bit fully segmented DAC by a factor of about 300 may be achieved (where montonicity is not required to be guaranteed), corresponding to an 8 bit improvement, is if twice the number of segments is used (i.e. 32 segments instead of 16), with each segment having an individual weight of ½ LSB. This improvement means that if the accuracy of the DAC is initially 10-bit, the accuracy of the new DAC after calibration will be around 18-bit. FIGS. 3 and 4 show linearity simulations for this exemplary 4-bit DAC over 500 randomizations. In particular, FIG. 3 shows the result of a DNL simulation whereas FIG. 4 shows the result of an INL simulation. In both cases the upper graph illustrates the performance prior to calibration whereas the lower graph shows the performance subsequent to calibration. Differential nonlinearity (DNL) is defined as the difference in output values of successive codes from the ideal value (equal to one Least Significant Bit (LSB)). The DNL error in LSBs terms for code n in a voltage output converter is given by:

$$DNL(n) = \frac{V_{out}(n) - V_{out}(n-1)}{1LSB} - 1 \qquad \text{Equation 1}$$

INL or integral nonlinearity of a DAC similarly refers to its accuracy. It is defined as the difference between the data converter output values and a reference straight line drawn though the first and last output values, INL defines the linearity of the overall transfer curve and can be described as:

$$INL(n) = \frac{V_{out}(n) - V_{\text{reference\_line}}(n)}{1LSB} \qquad \text{Equation 2}$$

As a further example, the initial accuracy of a 4-bit fully segmented DAC may be increased by a factor of about 300

Figure 11:
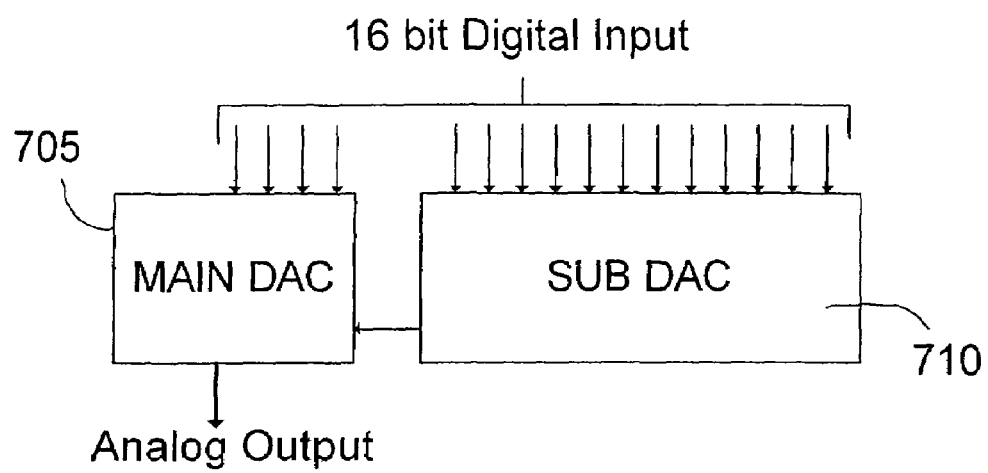
FIG. 11 shows an example of a main DAC+sub-DAC architecture in accordance with a further embodiment of the invention.

(where monotonicity is guaranteed), corresponding to a 8 bit improvement, if 64 segments instead of 16 are used, with each segment having an individual weight of ⅓ LSB. Referring to FIG. 11 as an example, if this exemplary 4-bit converter is used as the main DAC 705 together with a 12-bit sub-DAC 710 (which may be provided in string DAC configuration so as to provide montonicity as is disclosed in a co-pending and co-assigned US Patent Application claiming priority from provisional Applications U.S. 60/507,900 and/or U.S. 60/509,738), it is possible to design an accurate 16-bit DAC.

FIGS. 5 to 8 show the result of an INL simulation for a 4-bit DAC with a certain initial mismatch using no calibration and different calibration combinations according to the prior art and to the current invention. In all cases guaranteed monotonicity has been kept, so that the same segments are used for each subsequent code as were used for the previous code, and a new segment (or a plurality of segments if the weights of the individual segments are less than 1 LSB) is added for the next code.

In previous architectures requiring switching in a monotonic way, the number of current sources used would have been 16, and using the technique of the present invention this has been increased by 48 additional current sources (i.e. x=48, if $2^N$=16). The determination of the desired number of additional segments and their weightings will depend on the application and also the level of accuracy required. In the exemplary results shown in Table 1 below, monotonicity is assumed as a requirement. In such applications the same segments are used for each subsequent code as were used for the previous code, and a new segment (or a plurality of segments if the weights of the individual segments are less than 1 LSB) is added. The results shown in Table 1 represent results averaged over a statistically large sample size (approximately 100 randomizations). As will be observed from an examination of FIG. 5, the initial linearity of the uncalibrated DAC in this example is around 10-bit (the INL error is around 43 LSBs at 16-bit level, which is equivalent to 0.7 LSB at 10-bit). The same 64 current sources have been used in different calibration schemes guaranteeing monotonicity:

a) Uncalibrated: This arrangement is equivalent to the uncalibrated systems of the prior art. However, to ensure a fair comparison with the systems of the present invention, the inventor has (for the purposes of simulation) assigned four segments each of a ¼ weighting to each bit, i.e. the 64 current sources are grouped together in groups of 4, so that there are only 16 current sources available (each source consisting of 4 currents in parallel). The 16 current sources are used consecutively where the first is connected at code 1 the first two at code 2 the first three at code 3 etc.

b) "16 currents": This arrangement is equivalent to the calibrated system of Wegener & Kennedy. However, to ensure a fair comparison with the systems of the present invention, the inventor has (for the purposes of simulation) assigned four sources each of a ¼ weighting to each bit. As in the uncalibrated system, if this arrangement was not used in the simulation, the invention would have appeared to provide even greater improvement. In this arrangement the 64 current sources are grouped together in groups of 4, so that there is only 16 current sources available (each of them consisting of 4 currents in parallel). However, the 16 current sources are then calibrated based on the closest to the average value (for code 1 the closest current to the average is used, for code 2 the current which added to the current at code 1 gets the closest value to 2*average is used etc).

c) "16+48 currents": In this arrangement of the invention, only 16 current sources out of the 64 available are used in the actual DAC, i.e. 48 of the 64 sources are redundant. This redundancy means that there are a wider selection of sources available. However the outputs of all 64 are measured during the calibration stage and the selection of the 16 current sources is made at that time. For code 1 the current closest to the average is used, for code 2 the current source which added to the one at code 1 gets the closest value to 2*average is used with the first current source etc.). Each of the sources has a 1 LSB weighting.

d) "32+32 currents": In this arrangement of the invention, only 32 current sources out of the 64 available are used. However the outputs of all 64 are measured during the calibration stage and the selection of the 32 current sources is made at that time. For code 1 the group of 2 currents closest to 2*average is used, for code 2 the 2 currents which added to the two at code 1 gets the closest value to 4*average is used with the first two current sources etc.). Each of the sources has a ½ LSB weighting.

e) "48+16 currents": In this arrangement of the invention, only 48 current sources out of the 64 available are used. However the outputs of all 64 are measured during the calibration stage and the selection of the 48 current sources is made at that time. For code 1 the group of 3 currents closest to 3*average is used, for code 2 the 3 currents which added to the three at code 1 gets the closest value to 6*average is used with the first three current sources etc.). Each current source has a ⅓ LSB weighting.

Figure 5:
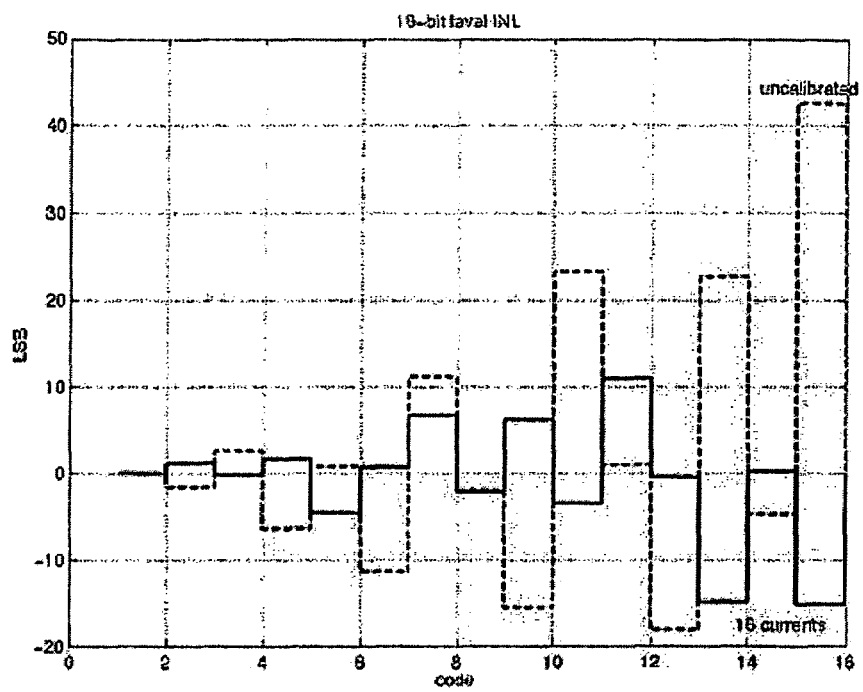
FIG. 5 shows a comparison between simulated INL results for an uncalibrated system of the prior art and a calibrated system according to a system based on the prior art of Wegener & Kennedy (discussed above)
Figure 6:
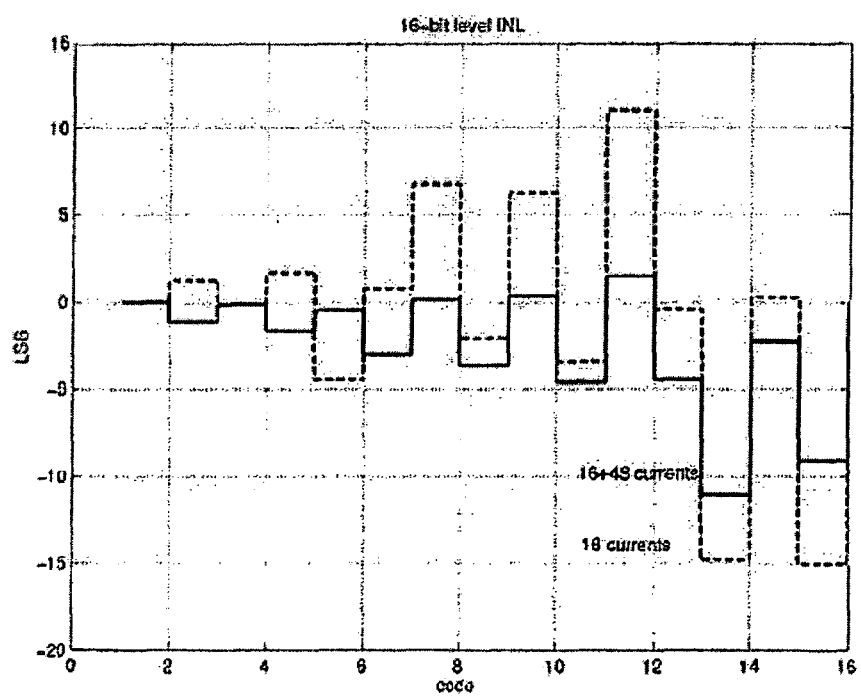
FIG. 6 shows a comparison between simulated INL results for a system based on the prior art of Wegener & Kennedy and a a calibrated system according to the invention having 64 segments of which only 16 are used
Figure 7:
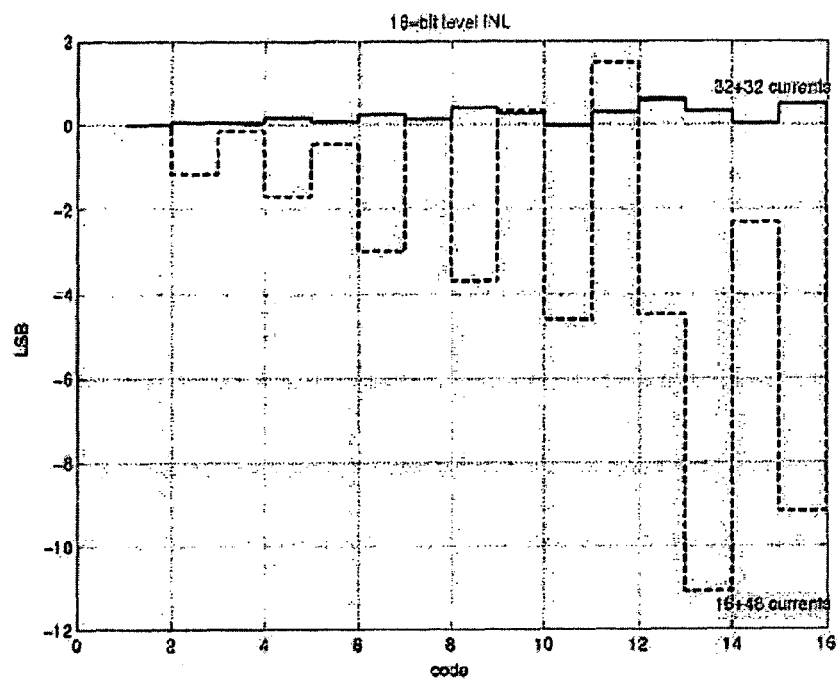
FIG. 7 shows a comparison between a calibrated system according to the invention having 64 segments of which only 16 with a weighting of one are used and a calibrated system according to the invention in which 32 out of sixty four segments are used, each segment having a weighting of ½.
Figure 8:
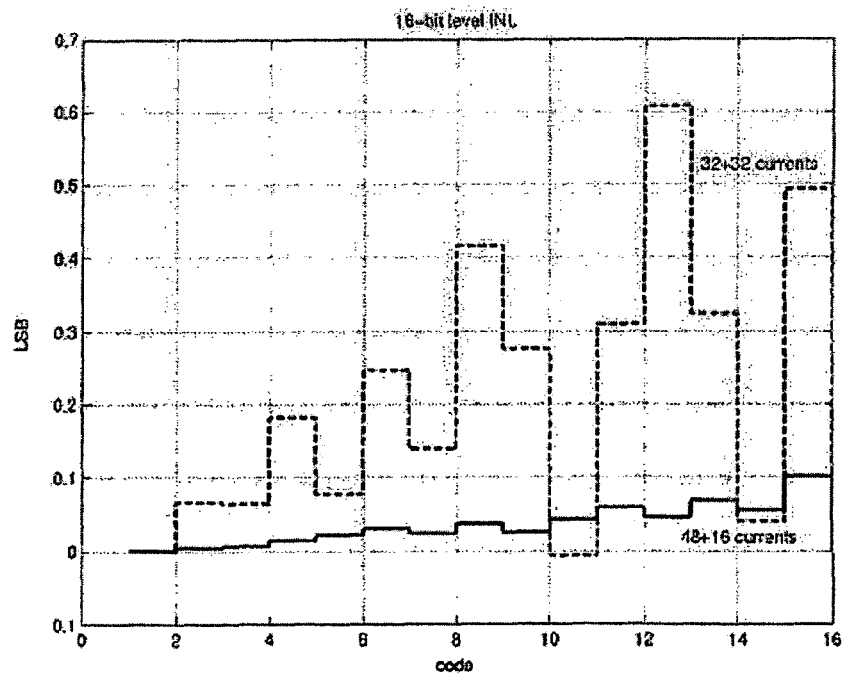
FIG. 8 shows a comparison between a calibrated system according to the invention in which 32 out of sixty four segments are used, each segment having a weighting of ½ and a calibrated system according to the invention in which 48 out of sixty four segments are used, each segment having a weighting of ⅓.

As will be observed from an examination of FIGS. 5 and 8, the initial linearity of the uncalibrated DAC in this example is around 10-bit and after calibration it is around 18-bit (when using the "48+16 currents" architecture). The level of segment redundancy incorporated into a converter and the weightings applied to segments will vary according the application and may depend on factors including the number of bits in the converter, the level of accuracy required and/or the resolution of the test system available for calibrating the converter. Thus practical values for weightings may suitably be defined as 1/Y, where Y is an integer greater than or equal to one and for circumstances in which redundancy is not present Y must be an integer greater than or equal to two. Typically, Y is not greater than 5, but there is no precise limit.

In previous architectures requiring switching in a monotonic way, the number of current sources used would have been 16, and using the technique of the present invention this has been increased by 48 additional current sources (i.e. x=48, if $2^N$=16). The determination of the desired number of additional segments will depend on the application and also the level of accuracy required. In the example of Table 1 below, the accuracy results of the different monotonic arrangements of a 4-bit example are shown (100 randomizations have been run in each case). The scale of improvement provided by the methodology of the present invention is evidenced from Table 1, an exemplary embodiment, where when using 64 current sources for a 4-bit DAC, the present invention provides an 8.2 bit INL improvement, which is equivalent to a factor of about 290. If the application does not require the segments to be switched in a monotonic way, then the combination of segments required for each code does not require such dependence on the previous code selection and the accuracy improvement is higher.

TABLE 1

| Architecure | No of current sources used/not used | weighting of each current source relative to 1 LSB | INL Improvement Factor | INL Improvement (in bits) |
|---|---|---|---|---|
| Uncalibrated | 16/0 | 1 | 0 | 0 |
| 16 currents | 16/0 | 1 | 2.2 | 1.2 |
| 16 + 48 currents | 16/48 | 1 | 4.4 | 2.1 |
| 32 + 32 currents | 32/32 | ½ | 81 | 6.3 |
| 48 + 16 currents | 48/16 | ⅓ | 290 | 8.2 |

Figure 9:
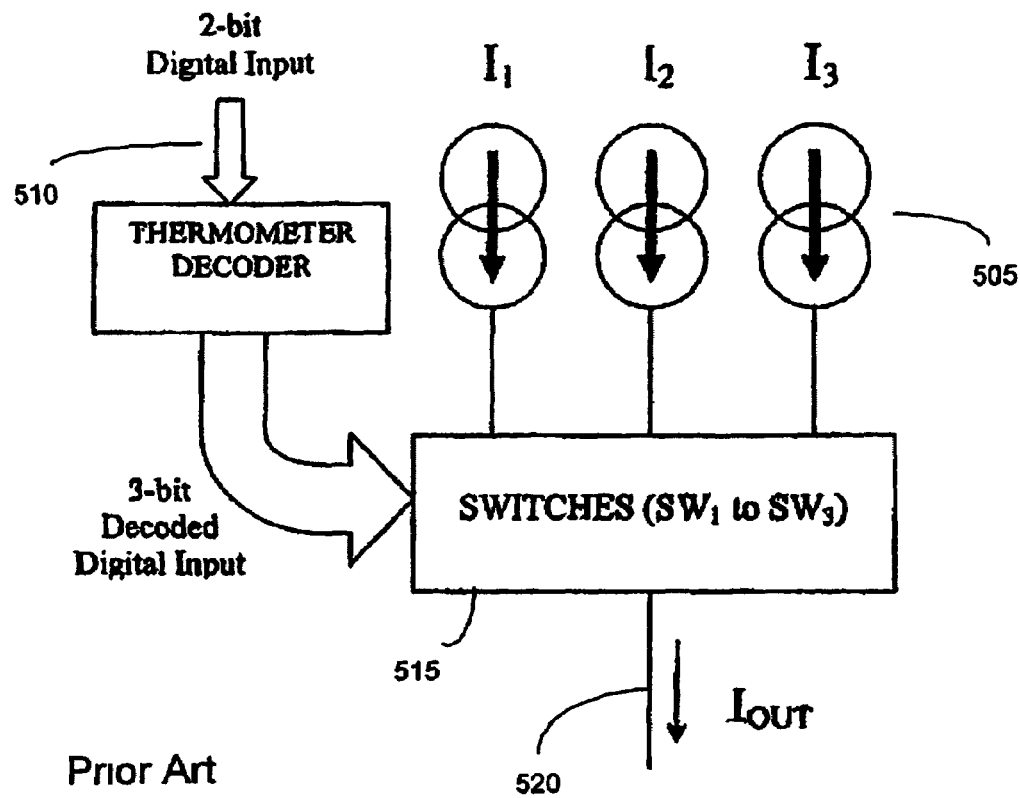
FIG. 9 shows in schematic form an example of a known 2-bit segmented current steering DAC.

In order to see a benefit of the application of the architecture of the present invention as compared to that of the prior art, an initial example of a 2-bit segmented current steering DAC in accordance with the prior art is shown in FIG. 9. The current steering DAC 500 of FIG. 9 is configured as a 2-bit DAC, i.e N=2. In this example, three individual segments are provided in the form of current sources 505. This equates with $2^N-1$ individual segments which as discussed above if the output for the input code 0 is zero or 1 LSB. The three current sources 505 are switched by a switching circuit in accordance with the input digital word 510 by one or more switches 515 to provide the desired output 520. The switches that are set ON for each code and the output current of the DAC are shown in Table 2.

TABLE 2

| Input Code | $SW_1$ | $SW_2$ | $SW_3$ | $I_{OUT}$ |
|---|---|---|---|---|
| 00 | OFF | OFF | OFF | 0 |
| 01 | ON | OFF | OFF | $I_1$ |
| 10 | ON | ON | OFF | $I_1 + I_2$ |
| 11 | ON | ON | ON | $I_1 + I_2 + I_3$ |

Figure 10:
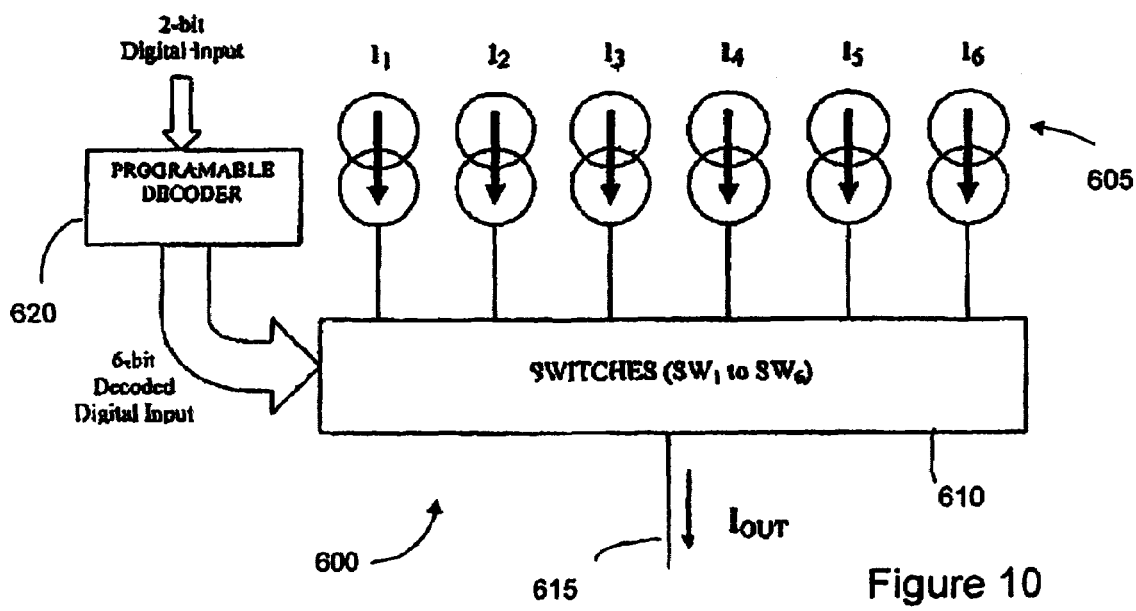
FIG. 10 shows in schematic form an equivalent converter to that of FIG. 9, but in accordance with the present invention.

An example of an equivalent converter 600 in accordance with the present invention is shown in FIG. 10 where 6 individual current sources 605 are used, as opposed to the three in FIG. 9. As such "x" in the determining equation $2^N-1+x$ is equal to 3 (N=2). Each of the current sources 605, which are provided in this exemplary embodiment as having a weight equivalent to ½ that of the LSB in the DAC, are coupled to a switching circuit (switches) 610, which can be programmed to effect the choice of combination of the current sources to determine the output 615. The choice of switching circuit\configuration is effected by suitable programming of a programmable decoder 620, which is interfaced to the switching block 610.

At digital input code 00, no current source is connected to the output, and at digital input code 11, all of them will be connected to the output. At digital input code 01, two of the current sources will be connected to the output. There are $C^6_2=15$ different possible combinations that can be chosen. Depending on the desired linearity improvement any of these combinations will be used for this code. At digital input code 10, four of the current sources will be connected to the output. There are again 15 different possible combinations that can be chosen ($C^6_4=15$). Depending on the desired linearity improvement, any of these combinations will be used for this code. It will be appreciated that this possible combination of elements of the DAC is greater than that achievable using the prior art implementation and is therefore advantageous.

Following this example, one way of calibrating the 2-bit DAC of FIG. 10 is set out below.

1—Measure the output of each one of the 6 DAC segments.

2—Calculate the Average. It will be appreciated that this value is typically 1 LSB/y where y is any number and is related to the number of segments connected in parallel for each LSB. The larger the value of y, the more combinations are available for each code and the better the accuracy. However, the larger the value of y, the more elements that are required as well. In this example y=2.

3—For each digital input code calculate the best combination of unitary DAC elements, which will generate the most accurate analog output (which is equal to 2*code*average).

4—Store this information in a memory such as a 4×6 bit memory (4 codes and 6 switches). The amount of memory can be reduced by using encoding schemes.

5—Decode each digital input code according to the information stored in the memory, so that the best combination for each code is used.

As an example: if there was a gradient effect causing a linear mismatch in the current sources so that $i_1$ is the lowest current and $i_6$ is the highest one, Table 3 would be a possible way of decoding the binary input code in order to improve the linearity of this 2-bit DAC

TABLE 3

| Input Code | $SW_1$ | $SW_2$ | $SW_3$ | $SW_4$ | $SW_5$ | $SW_6$ | $I_{OUT}$ |
|---|---|---|---|---|---|---|---|
| 00 | OFF | OFF | OFF | OFF | OFF | OFF | 0 |
| 01 | ON | OFF | OFF | OFF | OFF | ON | $I_1 + I_6$ |
| 10 | ON | ON | OFF | OFF | ON | ON | $I_1 + I_6 + I_2 + I_5$ |
| 11 | ON | ON | ON | ON | ON | ON | $I_1 + I_6 + I_2 + I_5 + I_3 + I_4$ |

There has been hereinbefore described an architecture that is adapted to provide an N-bit segmented DAC. The DAC of the present invention is provided additional number of segments (x) to that minimum number of segments required for a specific application. In applications that require $2^N$ segment, the number of segments in accordance with the present invention is given by $2^N+x$, whereas in applications that usually require $2^N-1$ segments, the number of segments that will be provided in accordance with the present invention is given by $2^N-1+x$ individual segments, at least one of which is weighted less than the least significant bit (LSB) of the overall DAC. By individually selecting from the segments for each input code the present invention provides for improvements in linearity of operation of the DAC than heretofore possible. It will be appreciated that determined selections are suitably determined by a calibration process performed as part of the manufacturing process and stored in a memory of the DAC at the same time.

Figure 12:
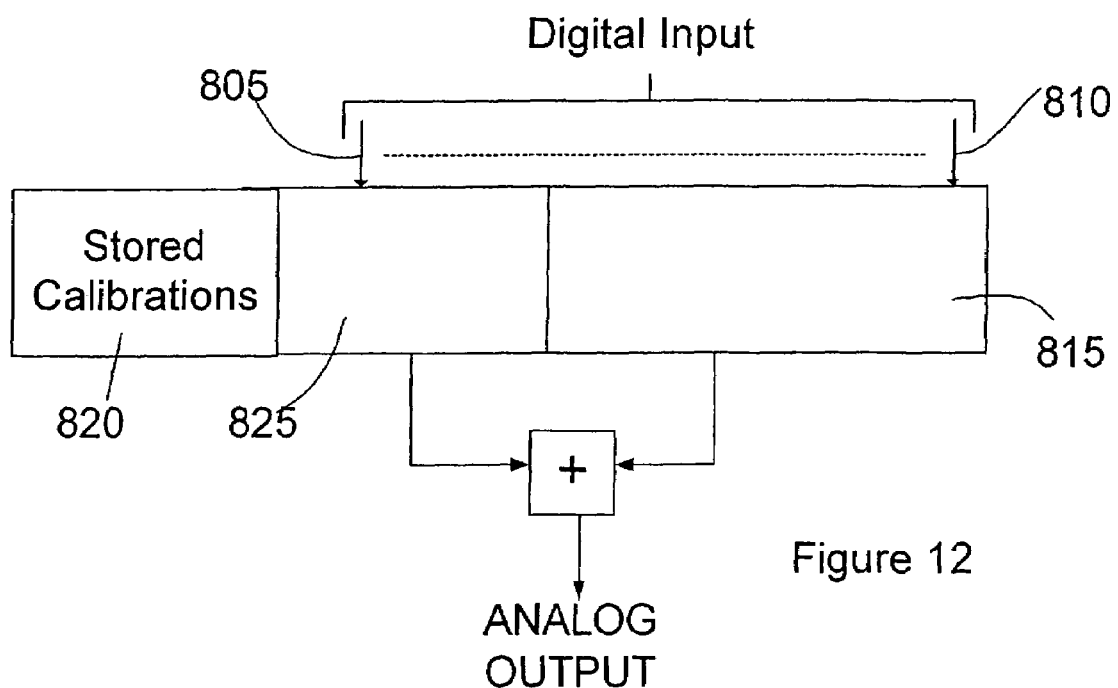
FIG. 12 shows an example of further digital-to-analog converter in accordance with the invention.

A further digital to analog converter is shown in FIG. 12 for providing an analog signal output on the basis of an N-bit digital input code. The converter comprises a first segment 825 and a second segment 815. The first segment providing a Most Significant Bit 805 (MSB) of the output. The second segment provides a Least Significant Bit 810 (LSB) of the output. The first segment is formed from a plurality of individual elements. The elements are selectively combined in accordance with a stored calibrated set of combinations 820. The number of elements provided in the first segment is equivalent to the minimum number of elements for a particular application incremented by a factor x, where x is greater or equal to one, and at least one of the elements has a weighting less than that of the least significant bit (LSB) of the first segment.

Figure 13:
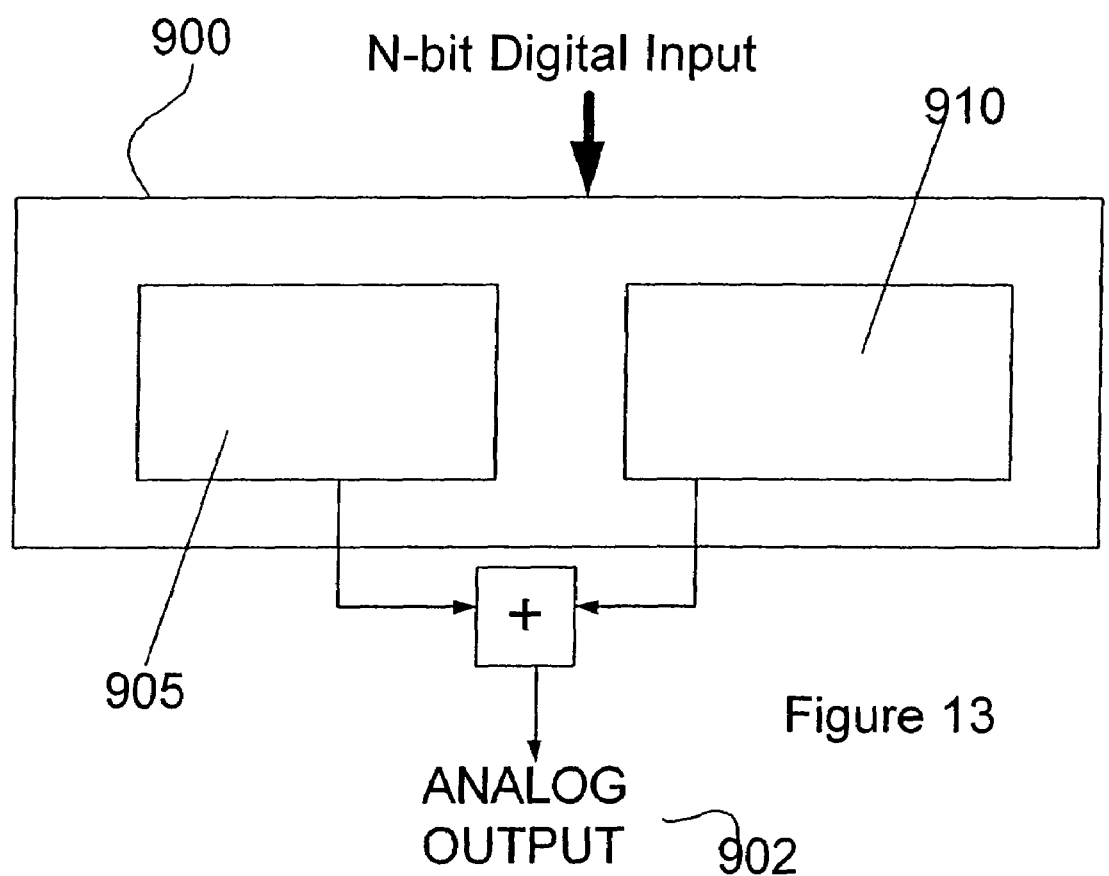
FIG. 13 shows an example of a segmented DAC in accordance with the present invention.

Another embodiment comprising a segmented DAC 900 is shown in FIG. 13. The DAC is adapted to provide an analog signal output 902 on the basis of a N-bit digital input code. The DAC is formed from a first group of individual segments 905 (shown in block form) and a second group of segments 910. Each segment in the first group has an output equivalent to one least significant bit. Each segment in the second group has an output which is less than equivalent to a least significant bit. The outputs of the first and second groups of segments are selectively combined so as to effect an output from the DAC having reduced linearity errors.

While the present invention has been described with reference to an exemplary embodiments it will be appreciated that they are not intended to limit the present invention in any way except as may be deemed necessary in the light of the appended claims.

The words comprises/comprising when used in this specification are to specify the presence of stated features, integers, steps or components but does not preclude the presence or addition of one or more other features, integers, steps, components or groups thereof.

The invention claimed is:

1. A non-power-of-two-scaled segmented digital to analog converter (DAC) adapted to provide an analog signal output on the basis of an N-bit digital input code, the DAC being formed from a plurality of individual segments, the segments being selectively combinable, in accordance with a stored set of calibrated combinations, to effect the output from the DAC in response to the input and wherein the number of segments provided in the DAC is equivalent to the minimum number of segments for a particular segmented DAC application incremented by x segments, where x is greater than or equal to two, and at least one of the segments has a weighting less than that of the least significant bit (LSB) of the overall DAC.

2. The DAC of claim 1 wherein each of the individual segments have a weighting less than that of the LSB of the overall DAC.

3. The DAC of claim 2, wherein the weighting of at least one segment may be stated as 1/Y, where Y is an integer greater than one.

4. The DAC of claim 3, wherein Y is an integer less than or equal to five.

5. The DAC of claim 1 wherein the minimum number of segments for a particular application is given by $2^N-1$ where N is the number of bits of the input code.

6. The DAC of claim 1 wherein the minimum number of segments for a particular application is given by $2^N$, where N is the number of bits of the input code.

7. The DAC of claim 1, further comprising a memory, wherein stored calibrated set of combinations are encoded prior to being stored in the memory.

8. The DAC of claim 7 wherein each digital input code is decoded in accordance with the information stored in the memory.

9. The DAC as claimed in claim 1 wherein the segmented architecture is provided for current scaling applications.

10. The DAC as claimed in claim 1 wherein the segmented architecture is provided for voltage scaling applications.

11. The DAC as claimed in claim 1 wherein the segmented architecture is provided for charge scaling applications.

12. The DAC as claimed in claim 1 whenever in combination with an additional sub-DAC, thereby forming a cascaded segmented main-DAC+sub-DAC architecture.

13. The DAC as claimed in claim 12 wherein the additional DAC is formed from a resistor string.

14. A segmented digital to analog converter (DAC) adapted to provide an analog signal output on the basis of a N-bit digital input code, the DAC being formed from:
 a first group of individual segments, each segment in the first group having an output equivalent to one least significant bit, and
 a second group of segments, each segment in the second group having an output which is less than equivalent to a least significant bit,
wherein the outputs of the first and second groups of segments are selectively combined to effect the output from the DAC to reduce linearity errors.

15. The DAC of claim 14 wherein the selective combination of segment is determined on a review of a calibrated set of combinations previously effected and stored for that DAC.

16. A method of providing an N-bit segmented Digital to Analog Converter (DAC), the method comprising the steps of:
 providing a plurality of individual segments, each of the individual segments having a weighting less than or equal to the least significant bit, the plurality being a number x greater than the minimum number of segments required for a specific application, and the individual segments can be selectively combined to provide an analog output depending on a digital input control code,
 measuring the output of each of the individual segments,
 determining a selection of the provided individual segments for each input control code based on the output of the measurement of the individual segments, and
 storing said selection for subsequent use in decoding each subsequent input control code.

17. The method as claimed in claim 16 wherein the step of determining the optimum selection includes determining an average value for all the segments.

18. The method as claimed in claim 16, wherein the determination of the selections of individual segments is such so as to guarantee monotonicity.

19. The method as claimed in claim 16, wherein said storing step comprises storing in a memory on the DAC.

20. A method of manufacturing an N-bit segmented Digital to Analog Converter (DAC) the method comprising the steps of:
 providing a plurality of individual segments having a weighting less that 1 least significant bit (LSB) application,
 providing a switching circuit for selectively combining segments to provide an analog output in response to a digital input control code,
 measuring the output of each of the individual segments,
 determining a selection of individual segments for each input control code based on the measurement step, and
 storing said selections in a memory for use by the switching circuit.

21. The method as claimed in claim 20 wherein the step of determining the selection includes determining an average value for all the segments.

22. The method as claimed in claim 21, wherein the determination of the selections of individual segments is such so as to guarantee monotonicity.

* * * * *